United States Patent [19]

Wells

[11] Patent Number: 4,609,881
[45] Date of Patent: Sep. 2, 1986

[54] FREQUENCY SYNTHESIZERS
[75] Inventor: John N. Wells, St. Albans, England
[73] Assignee: Marconi Instruments Limited, St. Albans, England
[21] Appl. No.: 607,398
[22] Filed: May 3, 1984
[30] Foreign Application Priority Data May 17, 1983 [GB] United Kingdom ................. 8313617

[51] Int. Cl.$^4$ .............................................. H03L 7/00
[52] U.S. Cl. .................................... 331/1 A; 331/16; 331/18; 331/25; 375/120; 455/260
[58] Field of Search ................. 328/14, 158; 331/1 A, 331/16, 18, 25; 375/120; 377/48; 455/260

[56] References Cited
U.S. PATENT DOCUMENTS 4,206,425  1/1980  Hossen ............................ 375/120 X
4,330,758  5/1982  Swisher et al. .................... 331/25 X

FOREIGN PATENT DOCUMENTS 2026268  1/1980  United Kingdom .
1560233  1/1980  United Kingdom .

Primary Examiner—Eugene R. LaRoche
Assistant Examiner—James C. Lee
Attorney, Agent, or Firm—Spencer & Frank

[57] ABSTRACT

A frequency synthesizer produces a variable frequency output using a controllable oscillator and a variable frequency divider which form part of a phase locked loop. The integer division ratio of the divider can be altered during a division cycle to simulate a fractional divisor value. The phase noise or jitter which is caused by the step change in divisor value is removed by altering the divisor value in accordance with the terms of a plurality of sequences, each of which sums to zero and which represents successive rows in a Pascal's triangle. A cascaded sequence of accumulators is used to determine the starting instants of each sequence, and the length of each sequence is dependent on the number of delay lines used. Although only four accumulators are illustrated, more can be added to give any desired degree of phase noise cancellation.

15 Claims, 5 Drawing Figures

| CLOCK PULSE NUMBER | 0 | 1 | 2 | 3 | 4 | 5 | 6 | 7 | 8 | 9 | 10 |
|---|---|---|---|---|---|---|---|---|---|---|---|
| VALUE ON LEAD 13 | X=1 | X=1 | X=1 | X=1 | X=1 | X=1 | X=1 | X=1 | X=1 | X=1 | X=1 |
| CONTENTS OF ACCUMULATORS: 14 | 0 | 1 | 2 | 3 | 4 | 5 | 6 | 7 | 8 | 9 | 10 |
| 15 | 0 | 1 | 3 | 6 | 10 | 15 | 21 | 28 | 36 | 45 | 55 |
| 16 | 0 | 1 | 4 | 10 | 20 | 35 | 56 | 84 | (C)120 | 65 | (C)20 |
| 17 | 0 | 1 | 5 | 15 | 35 | 70 | (C)126 | (C)10 | 30 | 95 | (C)15 |

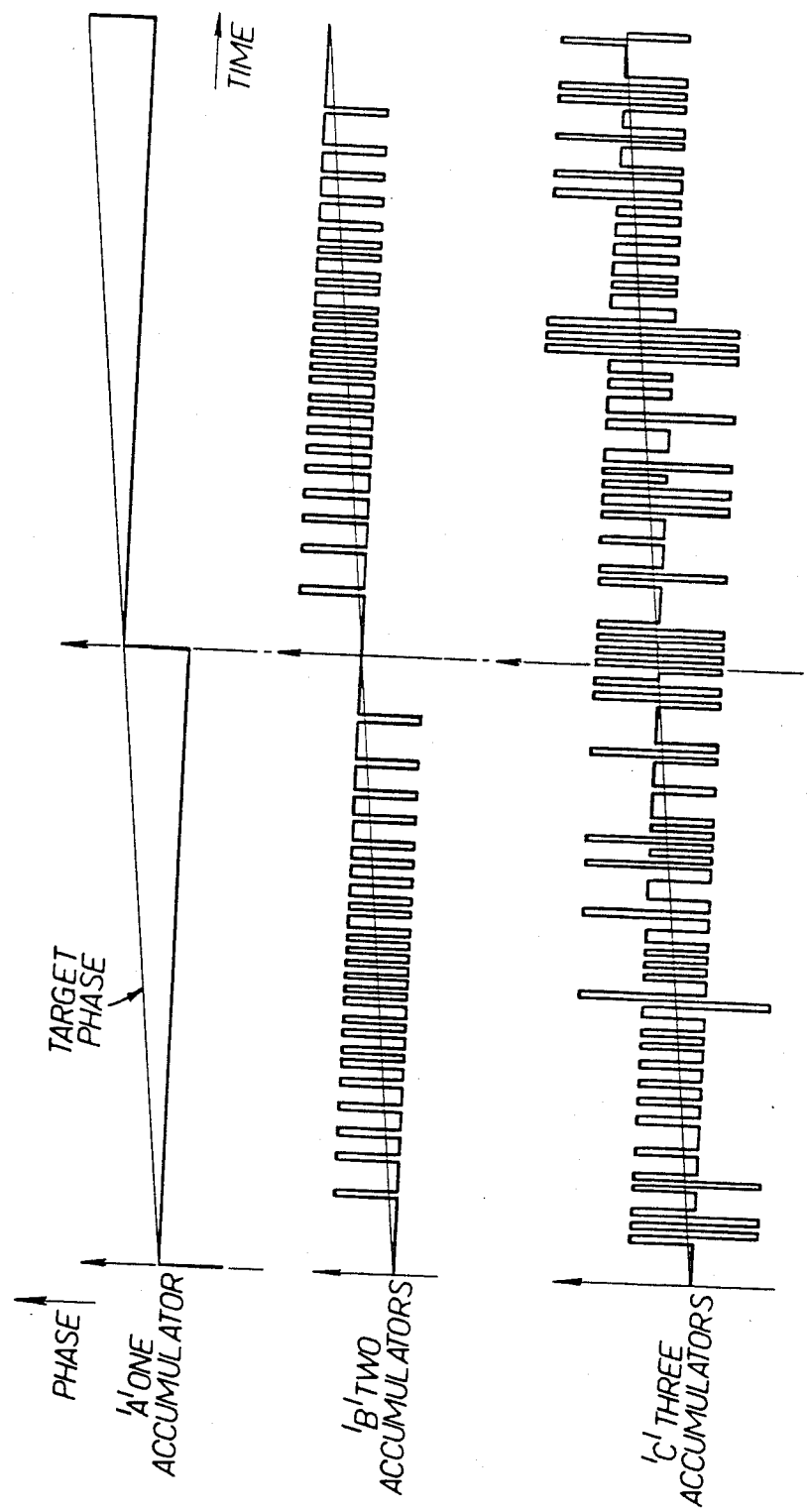

FREQUENCY SYNTHESIZERS

BACKGROUND OF THE INVENTION

This invention relates to frequency synthesizers. A frequency synthesizer is capable of generating an output frequency with an accuracy which is generally determined by the accuracy and stability of a reference frequency source. Often a variable frequency oscillator is coupled to the reference frequency source by means of a phase lock loop in which the output frequency $f_o$ is related to the reference frequency $f_r$ by the relationship $f_o = N \cdot f_r$, where N is a divisor by which the output frequency is divided before it is compared with the reference frequency. Conveniently, the factor N is produced by a frequency divider circuit or device, and it is clear that if N is an integer, the smallest increment in output frequency value is necessarily equal to the magniude of the reference frequency $f_r$ itself. This means that for a frequency synthesizer requiring fine resolution between its different possible output frequencies (i.e. a small stepsize between adjacent output frequencies), a very low reference frequency is needed, but this, in turn, requires an unacceptably long settling time constant for the phase lock loop.

It has been proposed to overcome this difficulty by using various expedients, particularly involving the use of a number of individual phase locked loops which are inter-related with each other, but these can cause spectrally impure output signals which are unsatisfactory for many applications. Additionally, the expense and complexity of multi-loop frequency synthesizers is a severe disadvantage.

An alternative solution is to adopt non-integral values of N in the relationship given above so that a relatively high value reference frequency can be used to generate output frequencies of fine resolution, while needing only a single phase lock loop to achieve them. Such a technique is often termed fractional-N-synthesis or sometimes called side-step programming. In practice, frequency dividers divide only by integral values, and fractional division is simulated by altering the integral value itself during the course of a division cycle. Thus the non-integer division ratios are simulated by dividing by, say N+1 instead of N on a proportion x of the cycles, giving an average division ratio which approximates closely to N+x where N is the integer portion and x is the fractional portion of the average value: e.g. if the average division ratio is, say. 123.45 then N is 123 and x is 0.45.

Switching between different values of N results in undesirable phase modulation or "jitter" and it has been proposed in U.K. Patent Specification No. 1560233 to negate its effect by generating a correction signal having a magnitude which alters in step with the changes which occur in the value of N so as to cancel the phase modulation which would otherwise appear as spurious sidebands in the synthesized output frequency signal. It is extremely difficult to control the magnitude of this correction signal with the necessary degree of accuracy over the whole of its required range, and the present invention seeks to provide a frequency synthesizer in which this difficulty is overcome.

SUMMARY OF THE INVENTION

According to a first aspect of this invention a frequency synthesizer includes a variable frequency oscillator, the output of which is fed via a frequency divider having a variable integer divisor value to a phase comparator, where it is compared with a reference frequency, the phase comparator being arranged to generate a control signal which is dependent on said comparison and which is used to control the frequency of said oscillator; means coupled to said frequency divider and responsive to a given fractional divisor value for periodically altering the divisor value by a predetermined integer amount so that the frequency divider has an effective divisor which corresponds to said fractional divisor value; said means also being arranged to periodically alter the divisor value in accordance with a plurality of predetermined sequences which represent successive rows in Pascal's triangle, the terms of which all sum to zero so as to offset phase differences present at said phase comparator and which stem from the alteration of the divisor value by said predetermined integer amount.

According to a second aspect of this invention, a frequency synthesizer includes a variable frequency oscillator, the output of which is fed via a frequency divider having a variable integer divisor value to a phase comparator, where it is compared with a reference frequency, the phase comparator being arranged to generate a control signal which is dependent on said comparison and which is used to control the frequency of said oscillator; first clocked accumulator means responsive to a fractional divisor value for periodically altering the divisor value by a predetermined integer amount when its contents reaches or exceeds a predetermined value so that the effective divisor value simulates said fractional divisor value; a cascaded plurality of further clocked accumulator means each of which is arranged to periodically alter the divisor value in accordance with respective predetermined sequences the terms of which all sum to zero so as to offset phase differences present at said phase comparator and which stem from the alteration of the divisor value by said predetermined integer amount, said accumulator means being arranged to integrate the contents of the preceding accumulator means.

BRIEF DESCRIPTION OF THE DRAWINGS

The invention is further described by way of example with reference to the accompanying drawings in which FIGS. 3, 4 and 5 are explanatory diagrams relating to the operation of the frequency synthesizer.

DESCRIPTION OF A PREFERRED EMBODIMENT

Figure 1:
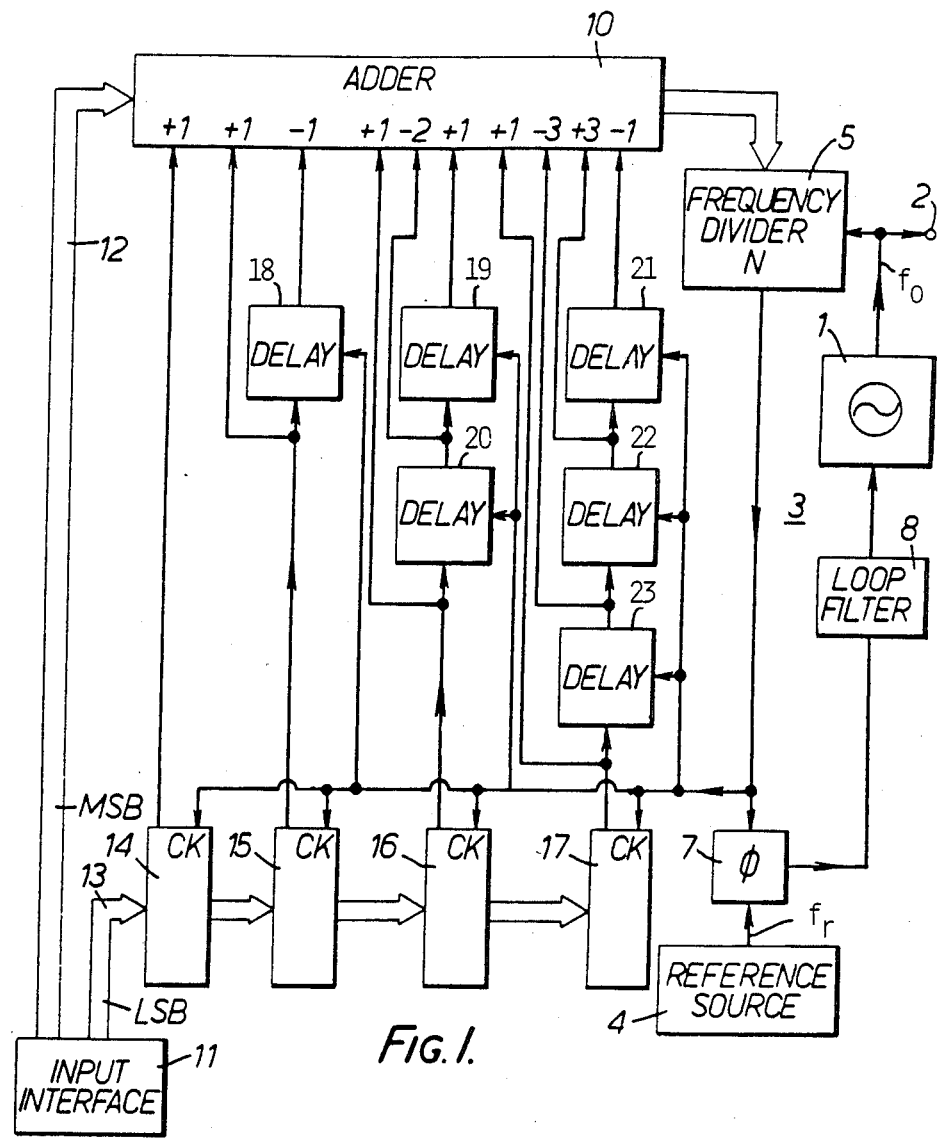
FIG. 1 shows a frequency synthesizer in block diagramatic form.

Referring to FIG. 1, a frequency synthesizer includes a variable frequency oscillator 1 which is controlled so as to provide a required synthesized output frequency $f_o$ at an output terminal 2. The oscillator 1 forms part of a phase locked loop 3 which is operative to generate a control signal which adjusts and constrains the oscillator to operate at the correct frequency value. The phase locked loop 3 locks the output signal to a multiple, which may be an integer or fractional value, of the reference frequency $f_r$ which is generated by a stable reference frequency source 4.

The output of the oscillator 1 is also fed via a variable ratio frequency divider 5 to one input of a phase comparator 7, where it is compared with reference frequency $f_r$ from the source 4. Any difference in phase or frequency between the two signals which are applied to the phase comparator 7 results in the value of a control signal which is fed via a low pass filter 8 to the oscillator 1 being altered so as to bring the frequency $f_o$ to its correct value.

Assuming for the moment that the frequency divider 5 is operative so as to produce an integer divisor value N, then the output frequency $f_o$ produced at terminal 2 is given by the relationship $f_o = N \cdot f_r$. As previously mentioned, the output frequency $f_o$ can be very accurately locked to the reference frequency $f_r$ but clearly it can only take values which are integral multiples of the reference frequency, and the multiple is determined by the choice of the value N. A frequency synthesizer of this kind suffers from the disadvantage that if a range of available output frequencies are required which differ from each other by only a small frequency interval or step, then this frequency interval determines the value of the reference frequency, since it must be equal to it. It is becoming increasingly common for the required interval between adjacent variable frequencies to be very small indeed, e.g. as low as 1 Hz, and the consequence of this requirement is that if N can take only integral values, then in theory the reference frequency must be 1 Hz as this follows directly from the above relationship. Clearly, reference frequencies of such a low value are not practicable, as they cannot provide stable oscillator outputs and the long settling time of the phase locked loop would be unacceptable, as it would be of the order of several seconds.

It has been proposed to obtain output frequencies having relatively small step intervals from a reference frequency having an acceptably high value by periodically altering the value of N during a single division cycle so as to simulate a fractional value. Such a process is commonly known as "fractional N frequency synthesis". Periodic alteration of the value of N has previously resulted in very undesirable phase modulation or jitter, in the signal which is applied to the phase comparator.

The divisor value of the frequency divider 5 is controlled by means of an adder 10, which receives from an input interface device 11, information over line 12 concerning the most significant bits of the required output frequency. These most significant bits refer to the integer portion of the overall frequency divisor value. In general, however, the required divisor value will not be an integer, but will instead include a fractional portion which is determined by the least significant bits of a required output frequency value. This information is fed over a line 13 to a series of cascaded accumulators 14, 15, 16 and 17. In this example only four accumulators are illustrated but additional accumulators can be provided as necessary.

The way in which data is transferred from one accumulator to another is explained in more detail subsequently with reference to FIG. 2. All of the accumulators have the same capacity, but because of the way they are inter-connected, those accumulators furthest away from the input interface device 11 will fill more rapidly than the others. When an accumulator is completely full, and its contents have thus reached a predetermined value, it generates an overflow or "carry" signal which is used to modify the effective division ratio of the frequency divider 5. The nominal integer value of the divisor is altered temporarily by an amount which depends on the accumulator which generates the instruction. It will be seen that the various inputs to the adder 10 carry an indication as to the polarity and size of change to the value N which is to be temporarily made. Apart from the first accumulator 14, the remaining accumulators 15, 16, 17 generate a sequence of alterations to the divisor value N in response to a single "carry" signal. Thus, accumulator 15 causes the value of N to increase by a value of 1, and then after a short delay to decrease by the same value. As will be seen, the accumulator 17 causes N to alter by the sequence of values $+1, -3, +3, -1$, and in each case the values of the terms in the sequence sum to zero so that there is no net effect on the simulated divisor value. The number of delay devices depends on the length of the sequence; thus accumulator 15 requires only a single delay device 18, accumulator 16 uses two delay devices 19, 20 and accumulator 17 uses the delay devices 21, 22, 23. In each case the delay device is a D-type bistable, and is clocked, like the accumulators, by the output of the divider 5. They could, however, be clocked by the output of the reference frequency source, since the two signals have the same frequency once the phase locked loop 3 has achieved lock. In general, each sequence is represented by successive rows of Pascal's triangle. Such a triangle is shown in FIG. 5 in which the first four rows relate to the accumulators 14, 15, 16, 17. The fifth and sixth rows indicate how the series of sequences would be developed as additional accumulators are added.

Figure 2:
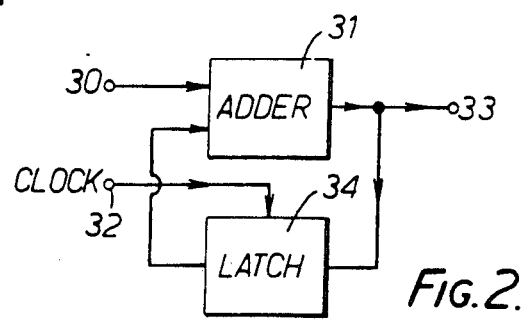
FIG. 2 shows part of it in greater detail.
Figures 3, 5:
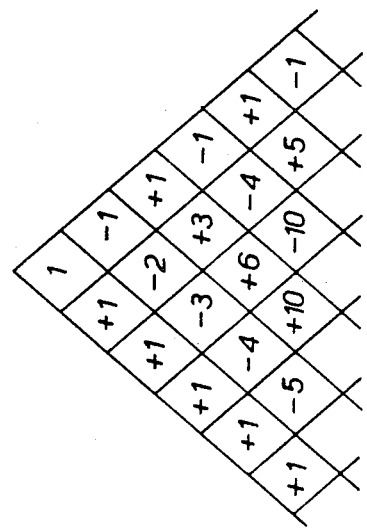

Referring to FIG. 2 in conjunction with FIG. 1, the fractional part of the required divisor value is fed over line 13 to terminal 30 of the accumulator 14 and is entered into the adder 31 so that it is added to an amount held in a latch 34. The new sum is instantly made available to the output terminal 33 and is also entered into the latch 34. On the next clock signal the contents of the latch 34 are clocked out and added to the same fractional part which is continuously present at terminal 30 to form a new, increased sum. FIG. 2 represents accumulator 14, but each of the accumulators 15, 16 and 17 also have the same configuration so that the output terminal 33 of accumulator 14 also represents the input terminal of accumulator 15.

The way in which the contents of the accumulators increase is described more fully with reference to the table shown in FIG. 3 for a series of ten clock pulses. It is assumed that initially all four accumulators are empty, and that in this example x equals unity and the value x is presented to the first accumulator 14 via lead 13, i.e. x represents the fractional part of the divisor value and is denoted by the least significant bits (lsb) on line 13. Thus on, say, clock pulse 4, accumulator 14 adds the value 1 to the value 3 already held in its latch to form a new contents of 4. Similarly accumulator 15 adds the value 4 (obtained from accumulator 14) to the value 6 already held in its latch to form a new contents of 10. Accumulator 16 adds the value 10 (obtained from accumulator 15) to the value 10 already held in its own latch to form a new contents of 20. Similarly, accumulator 17 produces an output of 35 on the 4th clock pulse.

As already mentioned, all accumulators have the same capacity, e.g. 100, and each time the capacity is filled, the carry signal is used to temporarily alter the value of N in the adder 10 on the occurrence of the next clock pulse. For each accumulator the overflow digit is shown as a C in brackets as it represents the "carry" value, and the accumulator holds only the remaining "tens" and "units". Although each accumulator is shown as being a separate device with a fixed capacity, clearly this need not be so as their function is merely to indicate when the respective accumulated sums reach predetermined threshold values. As such, they could take a variety of forms and need not be physically separate. This function could, in fact, be executed as part of a software routine, but of course, some form of accumulator means must be provided to generate the sequences.

Instead of providing the accumulators, or their equivalent software, the composite sequence, which is generated by the adder 10 from the individual sequences fed to it, can be obtained by first generating or calculating the sequence, and entering it into a store for subsequent use. Thus the accumulators 14, 15, 16, 17 and the delay circuits 18 to 23 can be replaced by a store which is accessed by the input interface 11. Such an alternative is practicable only where a very few predetermined fractional divisor values are needed, since the instants in time in which particular sequences are required will depend on these values. If the values are not predetermined, it will be necessary to derive them as needed using the illustrated circuits or their equivalents.

The overall effect of these changes in the value of the divisor is illustrated in FIG. 4. The target, i.e. ideal phase, of the signal produced by the divider 5 is plotted against time, and compared with the actual phase variations which are produced by using different numbers of accumulators. Thus, waveform 4A shows the effect of accumulator 14, and the single abrupt step represents the point at which the value of the integer N changes so as to simulate a fractional value. Waveform 4B represents the coarse action of the second accumulator 15 in combination with accumulator 14 in backing off the phase values. The low frequency component of this waveform is still very significant and would result in severe phase noise on the output signal at terminal 2. Waveform 4C represents the combined action of the three accumulators 14, 15 and 16, and is a waveform from which low frequency components have been largely removed. When it is compared with the reference source by the phase comparator 7, and the resulting control signal passed through the low-pass loop filter 8, the residual phase noise is negligible. The provision of the fourth accumulator 17 provides even further improvement, and additional cascaded accumulators can be provided as necessary, depending on the level of phase noise which is acceptable.

In general, it can be stated that the arrangement of cascaded accumulators has several properties. Every accumulator integrates the contents of the previous accumulator. Every accumulator, when it overflows, produces carry signals that cause modifications to the division ratio such as to back off the value of the parameter being accumulated. The pattern of modifications to the division ratio caused by the overflow of a particular accumulator is a summation of the pattern caused by an overflow from the previous accumulator with a similar pattern whose values are all negated and displaced in time by one clock period. It is this process which is represented by the Pascal triangle shown in FIG. 5. The total modification to the division ratio is a summation of the patterns caused by the overflow from all the accumulators.

However, as previously indicated, the function of the accumulators 15, 16, 17 is very different to that of accumulator 14. Accumulator 15 represents, in effect, just the first term of a correction network whose second and third other terms are provided by accumulators 16 and 17 respectively.

I claim:

1. A frequency synthesizer comprising
   a variable frequency oscillator;
   a frequency divider having an input coupled to the output of said variable frequency oscillator, said frequency divider having a variable integer divisor value;
   a phase comparator having a first input coupled to a reference frequency source and a second input coupled to the output of said frequency divider, the output of said phase comparator being coupled to said variable frequency oscillator to control the frequency thereof in accordance with the outputs of said reference frequency source and said frequency divider; and
   means coupled to said frequency divider and responsive to a given fractional divisor value for periodically altering said divisor value by a predetermined integer amount so that said frequency divider has an effective divisor which corresponds to said fractional divisor value, said means periodically altering said divisor value in accordance with a plurality of predetermined sequences which represent successive rows in Pascal's triangle, the terms of which all sum to zero so as to offset phase differences present at said phase comparator and which result from the alteration of said divisor value by said predetermined integer amount.

2. A frequency synthesizer as claimed in claim 1 wherein said predetermined sequences are combined to form a composite sequence which is stored for subsequent utilization to modify said divisor value.

3. A frequency synthesizer as claimed in claim 1 wherein said predetermined integer amount is unity.

4. A frequency synthesiser as claimed in claim 1 wherein the number of terms in said predetermined sequences increases progessively by unity.

5. A frequency synthesizer comprising
   a variable frequency oscillator;
   a frequency divider having an input coupled to the output of said variable frequency oscillator, said frequency divider having a variable integer divisor value;
   a phase comparator having a first input coupled to a reference frequency source and a second input coupled to the output of said frequency divider, the output of said phase comparator being coupled to the said variable frequency oscillator to control the frequency thereof in accordance with the outputs of said reference frequency source and said frequency divider;
   a first clocked accumulator means responsive to a given fractional divisor value for periodically altering said divisor value by a predetermined integer amount when its contents reaches or exceeds a predetermined value so that said frequency divider has an effective divisor which corresponds to said fractional divisor value; and
   a cascaded plurality of further clocked accumulator means each of which is arranged to periodically alter said divisor value in accordance with respective predetermined sequences, the terms of which all sum to zero so as to offset phase differences at said phase comparator and which result from the alteration of said divisor value by said predetermined integer amount, each accumulator means being arranged to integrate the contents of the preceding accumulator means.

6. A frequency synthesizer as claimed in claim 5 wherein each accumulator is arranged to initiate a respective predetermined sequence when its contents reaches or exceeds a predetermined value.

7. A frequency synthesizer as claimed in claim 6 wherein said predetermined value is the same for all of said accumulators.

8. A frequency synthesizer as claimed in claim 5 wherein all of said accumulators are clocked at the same frequency, said frequency corresponding to the frequency which is applied to said phase comparator.

9. A frequency synthesizer as claimed in claim 5 and wherein the number of terms in said predetermined sequences increases progressively for successively cascaded accumulators.

10. A frequency synthesizer as claimed in claim 6 and wherein the sequences represent successive rows in Pascal's triangle.

11. A frequency synthesizer as claimed in claim 5 wherein the occurrence of the terms in the respective predetermined sequences are spaced apart by periods corresponding to a cycle of the clock frequency at which the accumulators are clocked.

12. A frequency synthesizer as claimed in claim 7 wherein the sequences represent successive rows in Pascal's triangle.

13. A frequency synthesizer as claimed in claim 6 wherein the occurrence of the terms in the respective predetermined sequences are spaced apart by periods corresponding to a cycle of the clock frequency at which the accumulators are clocked.

14. A frequency synthesizer as claimed in claim 7 wherein the occurrence of the terms in the respective predetermined sequences are spaced apart by periods corresponding to a cycle of the clock frequency at which the accumulators are clocked.

15. A frequency synthesizer as claimed in claim 8 wherein the occurrence of the terms in the respective predetermined sequences are spaced apart by periods corresponding to a cycle of the clock frequency at which the accumulators are clocked.

* * * * *